(12) United States Patent
Osanai

(10) Patent No.: US 6,534,836 B1
(45) Date of Patent: Mar. 18, 2003

(54) MOSFET SEMICONDUCTOR DEVICE

(75) Inventor: Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/685,503

(22) Filed: Oct. 10, 2000

(30) Foreign Application Priority Data

Oct. 25, 1999 (JP) ............................................ 11-302536
Mar. 31, 2000 (JP) ...................................... 2000-098574
Sep. 21, 2000 (JP) ...................................... 2000-286913

(51) Int. Cl.[7] ............................................. H01L 29/76
(52) U.S. Cl. ........................ 257/401; 257/335; 257/341; 257/493; 438/284
(58) Field of Search ................................ 257/401, 341, 257/493, 335, 139; 438/284; H01L 29/78, 21/22, 29/225

(56) References Cited

U.S. PATENT DOCUMENTS 5,981,996 A * 11/1999 Fujishima .................... 257/335

FOREIGN PATENT DOCUMENTS

JP          10154810 A    *  6/1998    .......... H01L/21/336

* cited by examiner

Primary Examiner—Nathan J. Flynn
Assistant Examiner—Scott R Wilson
(74) Attorney, Agent, or Firm—Adams & Wilks

(57) ABSTRACT

A power MOSFET semiconductor device high in breakdown voltage and low in resistance can be manufactured at a low cost and in a short turnaround time. In a planar-type power MOSFET, a manufacture method comprises forming a trench in a drift region, and forming a body diffusion layer on a trench side wall and bottom portion (forming the trench and subsequently performing diffusion) to obtain a structure. Deep body diffusion formation is effective for obtaining the high breakdown voltage and low resistance, but to attain the structure, usually epitaxial growth and selective formation of a deep body region have to be performed a plurality of times, and with an increase of manufacture steps, souring of manufacture cost and lengthening of manufacture period are caused. However, the present structure can further simply bring about the similar effect. It is possible to supply the power MOSFET semiconductor device at the low cost and in the short manufacture turnaround time.

17 Claims, 5 Drawing Sheets

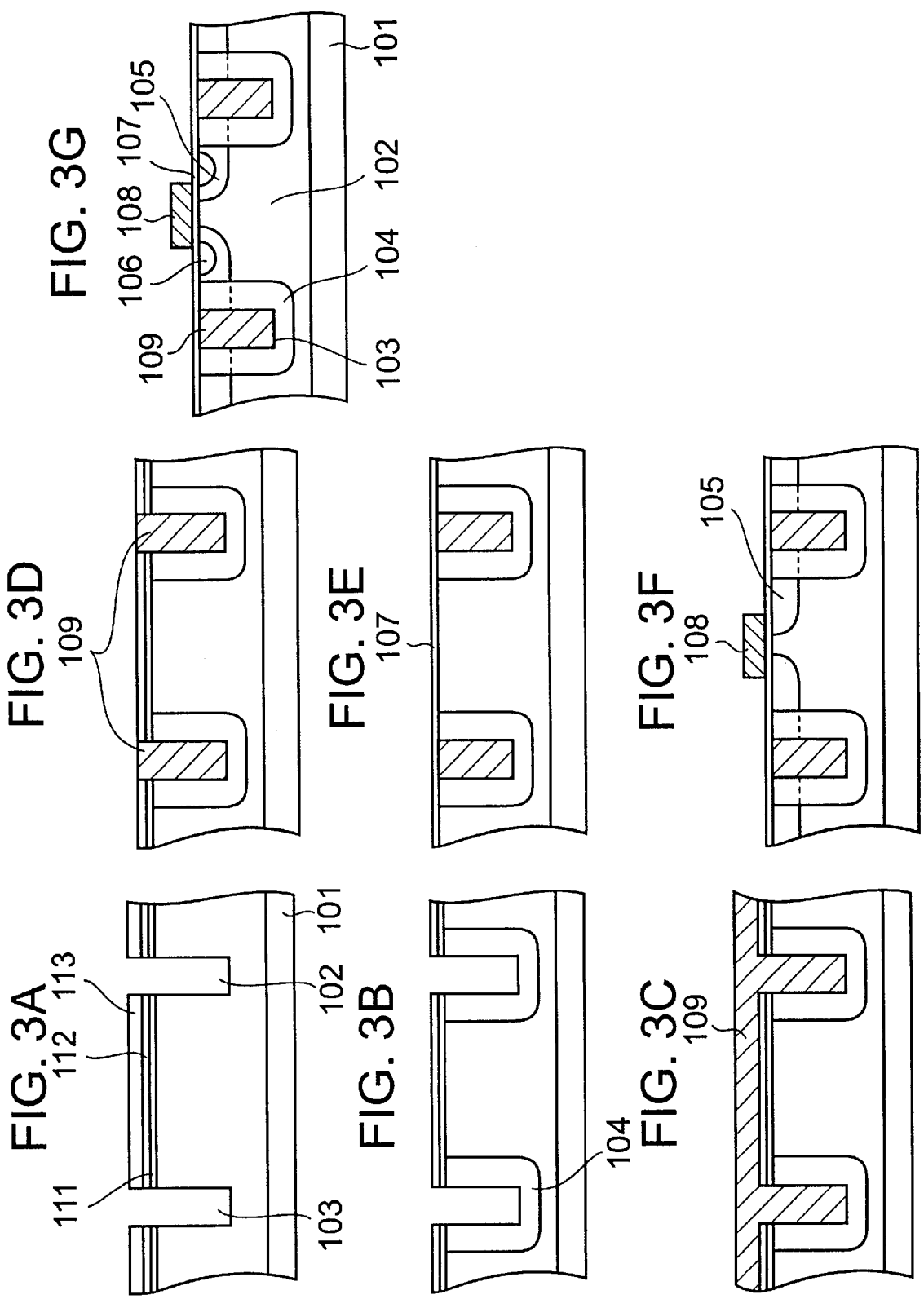

MOSFET SEMICONDUCTOR DEVICE

BACKGROUND OF THE INVENTION

1. Field of the Invention

The present invention relates to a structure of a power MOSFET semiconductor device high in breakdown voltage and low in resistance and to a method of manufacturing the device.

2. Description of Related Art

FIG. 6 is a sectional view of a conventional power MOSFET. In order to attain high breakdown voltage and low on-resistance, so-called body diffusion is partially incorporated into a drift region of a drain in a structure. During the time the MOSFET is off, depletion layers extend from both sides of the deep body diffusion to contact each other in the middle. Specifically, in this case the drift region under a gate electrode 108 completely constitutes the depletion layer to a depth substantially equal to that of the deep body diffusion. Since a depletion layer width is very large, electric field relaxing action is large, and breakdown voltage can be enhanced without decreasing an impurity density of the drift region. On the other hand, since the density of the drift region does not need to be lowered, it is unnecessary to lower a drift parasitic resistance during an on state, and it is also possible to keep MOSFET on-resistance low.

To achieve a conventional structure, however, epitaxial growth and selective formation of a deep body region have to be performed a plurality of times, and with an increase in the number of manufacture steps, increase in manufacture cost and lengthening of manufacture period result.

For example, when a drain breakdown voltage of several hundreds of volts or more is realized, the deep body region needs a depth of five to a dozen micrometers, but in this case the epitaxial growth and selective formation of the deep body region need to be repeated around six times.

SUMMARY OF THE INVENTION

In order to solve the aforementioned problems, the present invention uses the following means.

(1) There is provided a semiconductor device comprising a high impurity concentration first conductivity type semiconductor substrate, a low impurity concentration first conductivity type semiconductor layer formed on a surface of the semiconductor substrate, a trench selectively formed in a surface of the low impurity concentration semiconductor layer, a low impurity concentration second conductivity type semiconductor diffusion layer formed on a side wall and a bottom wall of the trench, a relatively shallow low impurity concentration second conductivity type semiconductor diffusion layer partially overlapped with the second conductivity type semiconductor diffusion layer and selectively formed on the surface of the low impurity concentration first conductivity type semiconductor, a high impurity concentration first conductivity type semiconductor diffusion layer selectively formed in the relatively shallow low impurity concentration second conductivity type semiconductor diffusion layer, a gate insulation film formed on the low impurity concentration first conductivity type semiconductor layer and the relatively shallow low impurity concentration second conductivity type semiconductor diffusion layer, and a gate electrode selectively formed on the gate insulation film.

(2) The inside of the trench formed in the low impurity concentration first conductivity type semiconductor layer is filled with an insulation film in the semiconductor device.

(3) The inside of the trench formed in the low impurity concentration first conductivity type semiconductor layer is filled with first conductivity type polycrystalline silicon in the semiconductor device.

(4) A manufacture method of a semiconductor device, comprising steps of: forming a low impurity concentration first conductivity type semiconductor layer on a high impurity concentration first conductivity type semiconductor substrate by epitaxial growth, selectively forming a trench in a surface of the low impurity concentration semiconductor layer, forming a low impurity concentration second conductivity type semiconductor diffusion layer on a side wall and a bottom wall of the trench, partially overlapping a relatively shallow low impurity concentration second conductivity type semiconductor diffusion layer with the second conductivity type semiconductor diffusion layer disposed on the side wall and the bottom wall of the trench and selectively forming the relatively shallow low impurity concentration second conductivity type semiconductor diffusion layer in the low impurity concentration first conductivity type semiconductor layer, selectively forming a high impurity concentration first conductivity type semiconductor diffusion layer in the relatively shallow low impurity concentration second conductivity type semiconductor diffusion layer, forming a gate insulation film on the low impurity concentration first conductivity type semiconductor layer and the relatively shallow low impurity concentration second conductivity type semiconductor diffusion layer, and selectively forming a gate electrode on the gate insulation film.

(5) The manufacture method of the semiconductor device further comprises a step of filling the inside of the trench formed in the low impurity concentration first conductivity type semiconductor layer with an insulation film.

(6) The manufacture method of the semiconductor device further comprises a step of filling the inside of the trench formed in the low impurity concentration first conductivity type semiconductor layer with polycrystalline silicon.

(7) The step of forming the low impurity concentration second conductivity type semiconductor diffusion layer on the side wall and the bottom wall of the trench comprises solid phase diffusion from an oxide film including an impurity in the manufacture method of the semiconductor device.

(8) The step of forming the low impurity concentration second conductivity type semiconductor diffusion layer on the side wall and the bottom wall of the trench comprises solid phase diffusion from polycrystalline silicon including an impurity in the manufacture method of the semiconductor device.

(9) The step of forming the low impurity concentration second conductivity type semiconductor diffusion layer on the side wall and the bottom wall of the trench comprises a molecular layer doping process in the manufacture method of the semiconductor device.

BRIEF DESCRIPTION OF THE DRAWINGS

FIGS. 3A to 3G are sectional views in order of steps, showing a first manufacture method of the first embodiment of the semiconductor device of the present invention.

DETAILED DESCRIPTION OF THE PREFERRED EMBODIMENTS

Embodiments of the present invention will be described hereinafter with reference to the drawings.

Figure 1:
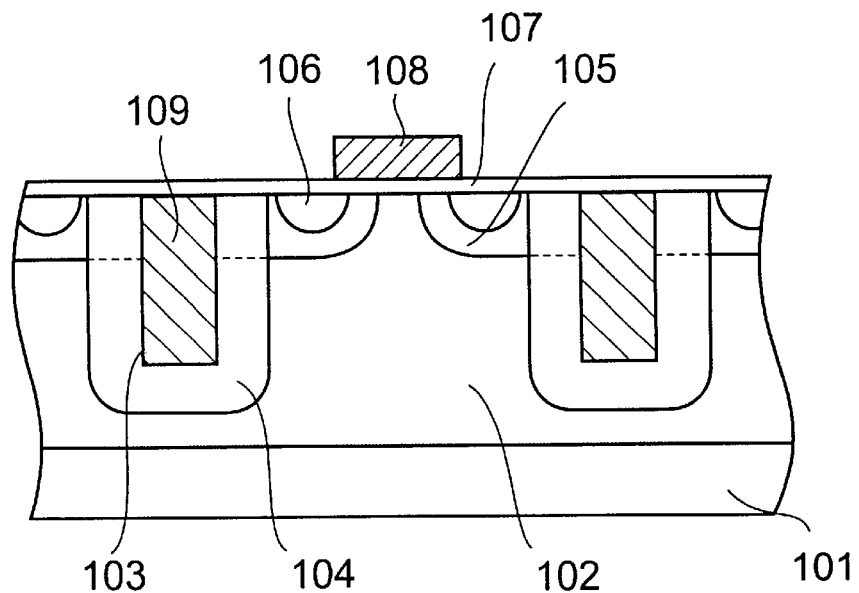
FIG. 1 is a schematic sectional view showing a first embodiment of a semiconductor device of the present invention.

FIG. 1 is a schematic sectional view showing a first embodiment of a semiconductor device of the present invention. After a low impurity concentration drift layer 102 is formed on a semiconductor substrate 101 such as high impurity concentration single-crystal silicon, a trench 103 selectively formed in the drift layer, a diffusion layer 104 is formed on a side wall and bottom wall of the trench, and an insulation film 109 for filling the inside of the trench are formed, and further to constitute power NOSFET, a source 106, a body diffusion layer 105, a gate insulation film 107, and a gate electrode 108 are formed. The body diffusion layer 105 is partially overlayed with the diffusion layer 104.

When the power MOSFET is NMOS, for example, a single crystal silicon substrate including antimony or arsenic with a density of $1 \times 10^{19}/cm^3$ to $1 \times 10^{20}/cm^3$ is used, and for example, an epitaxial layer with a phosphorus density of $1 \times 10^{14}/cm^3$ to $5 \times 10^{16}/cm^3$ is used as the drift layer. A thickness of the epitaxial layer differs with a required breakdown voltage, but is usually in a range of five to a dozen micrometers with an operation voltage up to about several hundreds of volts. The thickness of the trench depends on the required breakdown voltage similarly as the epitaxial layer thickness, but is in a range of about 3 to 10 $\mu$m and is slightly shallower than the epitaxial layer. The density of the diffusion layer formed on the side wall and bottom portion of the trench is usually in a range of $1 \times 10^{16}/cm^3$ to $1 \times 10^{18}/cm^3$ and the diffusion of the depth and transverse directions is of the order of 0.5 to 2 $\mu$m. Parameters such as the density, depth, and thickness of the body diffusion layer, source and gate insulation film indicate numeric values similar to those of the usual power MOSFET.

In FIG. 1 the structure enhances element performance. Specifically, when the MOSFET is off, depletion layers extend from both sides of the body diffusion layer formed on the trench side wall to contact each other in a middle so that a drift region under the gate electrode is completely formed into the depletion layer to a depth substantially equal to that of deep body diffusion. Since a depletion layer width is very large, electric field relaxation action is large and breakdown voltage can be enhanced without lowering an impurity density of the drift region. Since the density of the drift region does not need to be lowered, a drift parasitic resistance during the time the MOSFET is on does not have to be lowered, and MOSFET on-resistance can be kept low. These effects are obtained similarly as the conventional example. Additionally, as compared with the conventional method, the epitaxial growth and selective formation of the deep body region do not need to be performed a plurality of times, and the formation of the trench and diffusion layer may be performed once, so that with considerable simplification of manufacture steps, effects such as cost reduction and manufacture period reduction are brought about.

Furthermore, in the embodiment of FIG. 1, the diffusion layer 104 can be formed simultaneously with the body diffusion layer 105, and the effects are enlarged in this case. Details will be described below.

Figure 2:
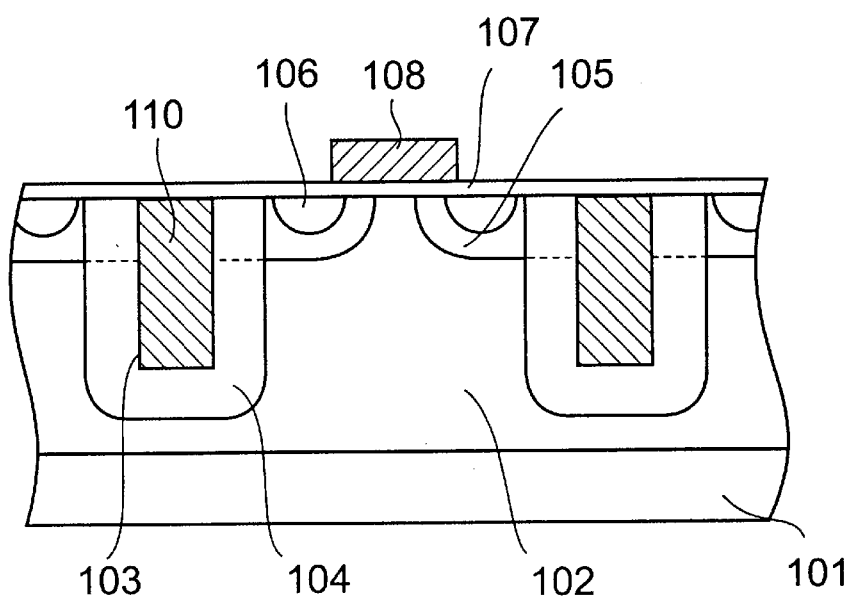
FIG. 2 is a schematic sectional view showing a second embodiment of the semiconductor device of the present invention.

FIG. 2 is a schematic sectional view showing a second embodiment of the semiconductor device of the present invention. The basic concept is similar to that of the embodiment of FIG. 1, but the second embodiment is characterized in that the inside of the trench 103 is filled with polycrystalline silicon 110 including an impurity. By employing such a structure, the diffusion layer disposed on the side wall and bottom wall of the trench can be formed by diffusing the impurity from the polycrystalline silicon 110, and a further reduction in the number of manufacturing steps is possible. In this case, it is necessary to use a method of performing a doped poly-process or the like to introduce the impurity beforehand into the polycrystalline silicon 110 simultaneously during filling with polycrystalline silicon. A manufacture method of the present embodiment will be described in detail below.

FIG. 3 shows sectional views in the order of processing steps, showing a first method of manufacturing the first embodiment of the semiconductor device of the present invention. As an example, an N-type power MOSFET is used.

FIG. 3A shows a method comprising the steps of forming the low impurity concentration drift layer 102 with a density of phosphorus as an N-type impurity in a range of $1 \times 10^{14}/cm^3$ to $5 \times 10^{16}/cm^3$ and with a thickness of about 5 $\mu$m to a dozen micrometers on the high impurity concentration semiconductor substrate 101 including antimony or arsenic as the N-type impurity with a density of $1 \times 10^{19}/cm^3$ to $1 \times 10^{20}/cm^3$ by an epitaxial growth process, and subsequently growing an oxide film 111 by about 500 angstroms by oxidation with an electric furnace or the like, and then depositing a nitride film 112 of about 1000 angstroms to 2000 angstroms by a chemical vapor development process (CVD) and further depositing a mask oxide film 113 of about 2000 angstroms to 1 micron by a CVD process and subsequently patterning the mask oxide film 113 by a photolithography process and etching process, and stripping a resist and using the patterned mask oxide film 113 as a mask to form the trench 103 in the nitride film 112, oxide film 111 and low-density drift layer 102 by a dry etching process. A narrower width of the trench 103 is more advantageous in respect of an area, but the width is appropriately in a range of about 0.5 $\mu$m to 2 $\mu$m in consideration of the subsequent filling inside the trench and the doping of the impurity into the trench bottom wall and side wall. Moreover, for a trench depth, since the bottom portion needs to stay in the low impurity concentration drift layer, a depth of the order of 3 $\mu$m to 10 $\mu$m is appropriate.

The dry etching of the nitride film 112, oxide film 111 and trench 103 using the mask oxide film 113 as the mask can be performed by changing gas for each material to be processed. Moreover, the mask oxide film 113 may be an oxide film of NSG, PSG or TEOS.

Subsequently as shown in FIG. 3B, for example, by using the ion injection process to introduce boron as a P-type impurity into the trench side wall and bottom portion by angle injection or rotation injection and subsequently performing heat treatment, the diffusion layer 104 is formed. Moreover, the diffusion layer 104 can be formed as shown in the drawing even by a molecular layer doping process. The boron density of the diffusion layer 104 is usually in a range of $1 \times 10^{16}/cm^3$ to $1 \times 10^{18}/cm^3$, and diffusion in depth and transverse directions is of the order of 0.5 to 2 $\mu$m.

Subsequently, as shown in FIG. 3C, after selectively stripping the mask oxide film 113 by wet etching, the insulation film 109 is deposited inside the trench 103 and on the nitride film 112 by CVD process. From a viewpoint of coverage, when TEOS oxide film is used, the insulation film 109 can easily fill the inside of the trench. In this case, since the thickness needs to be equal to or more than a trench width, deposition is performed in a range of about 0.5 μm to 2 μm. When this thickness is impossible in one step, the deposition may be performed a plurality of times in a divided manner.

Subsequently, as shown in FIG. 3D, the insulation film 109 is etched back by the dry etching process. The etching is ended by end point detection upon exposing of the nitride film 112. Moreover, this step may be performed by a chemical machine polishing process (CMP).

Subsequently, by removing the nitride film 112 by the wet etching process or the dry etching process by phosphoric acid, further removing the oxide film 111 by wet etching, and subsequently forming the gate insulation film 107 by oxidation in the electric furnace, a structure shown in FIG. 3E is obtained. The thickness of the gate oxide film depends on the required breakdown voltage, but is usually in a range of 200 angstroms to 800 angstroms.

Subsequently, as shown in FIG. 3F, by patterning polycrystalline silicon with the impurity doped therein in a high density by the photolithography process and dry etching process to form the gate electrode 108, and using the gate electrode 108 as the mask, the body diffusion layer 105 as a power MOSFET body is selectively formed in the low impurity concentration drift layer 102 by ion injection and heat treatment. For the density and diffusion amounts of vertical and transverse directions of the body diffusion layer 105, when boron is used as the P-type impurity similarly as the diffusion layer 104, the density is of the order of $1\times10^{16}/cm^3$ to $1\times10^{18}/cm^3$, and the diffusion amount is of the order of 0.5 to 2 μm. In the formation, for example, BF2 ion is injected with a dose amount of about $1\times10^{13}$ to $5\times10^{14}/cm^2$, the heat treatment of 1000° C. to 1100° C. is performed for several tens of minutes, and other conditions are used. Moreover, the body diffusion layer 105 is securely brought into contact with the previously formed diffusion layer 104.

Subsequently, as shown in FIG. 3G, the power MOSFET source 106 is formed by using the gate electrode 108 as the mask and performing the ion injection and heat treatment. Arsenic is used as the N-type impurity, and the density is of the order of $1\times10^{19}/cm^3$ to $1\times10^{20}/cm^3$.

The structure shown in the first embodiment of the present invention is obtained by the aforementioned manufacture method.

FIG. 4 shows sectional views in order of manufacturing steps, showing a second method of manufacturing the semiconductor device of the first embodiment according to the present invention.

Figure 4A:
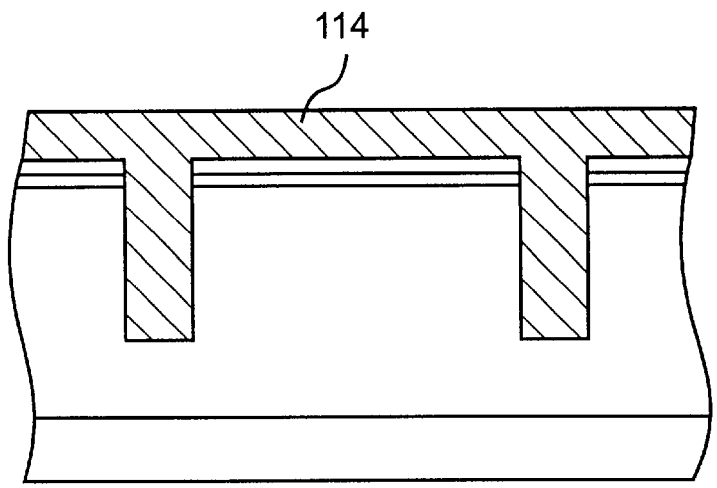
FIGS. 4A to 4C are sectional views in order of steps, showing a second manufacture method of the first embodiment of the semiconductor device of the present invention.

By performing steps similar to those of FIG. 3A until the trench formation, and subsequently selectively stripping the mask oxide film 113 by wet etching as shown in FIG. 4A, an insulation film 114 including the impurity is formed inside the trench 103 and on the nitride film 112 by a CVD process or a spin on glass (SOG) process. With the N-type power MOSFET, as the insulation film 114 including the impurity, for example, BSG, that is, the oxide film including boron is used.

Figure 4B:
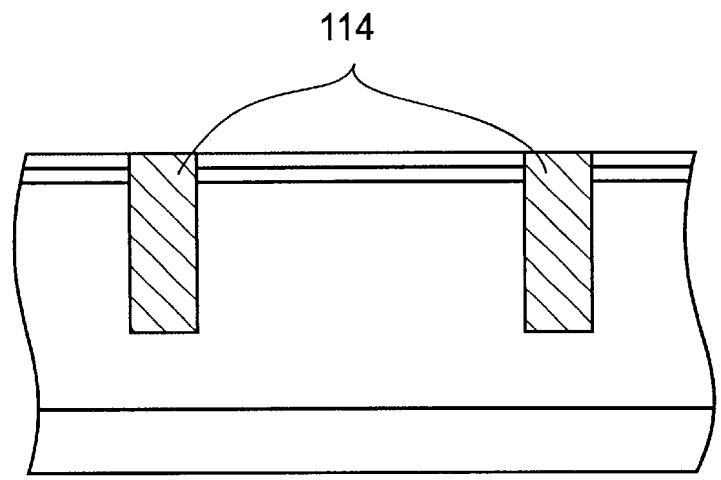

Subsequently, as shown in FIG. 4B, the insulation film 114 including the impurity is removed by etching back or CMP until the nitride film 112 is exposed.

Figure 4C:
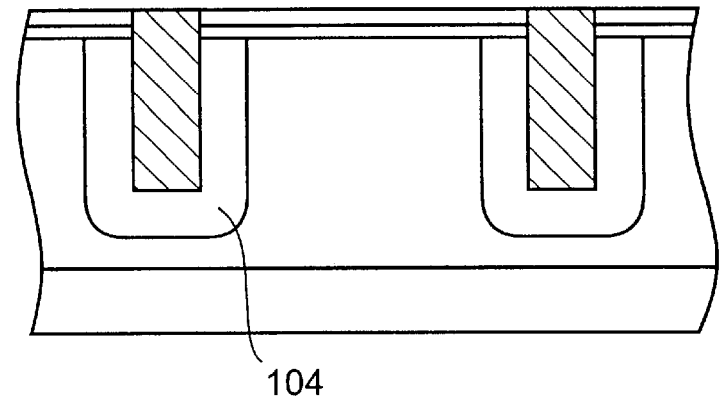

Subsequently, by performing the heat treatment to diffuse boron from the insulation film including the impurity, the diffusion layer 104 is formed as shown in FIG. 4C.

Thereafter, similar to the manufacture method described with reference to FIG. 3, while the insulation film 114 including the impurity is left in the trench, the nitride film and oxide film are removed and the gate oxide film, gate electrode, body diffusion layer, and source may successively be formed. Alternatively, after the insulation film 114 including the impurity is removed by wet etching, the filling step of the insulation film 109 may be performed similarly as FIG. 3. Unless a particular problem arises, and since the number of steps is small, advancement to the subsequent step with the insulation film 114 including the impurity left in the trench is advantageous in respect of cost and work period.

FIG. 5 shows sectional views in the order of manufacturing steps, showing a first manufacturing method of a second embodiment of the semiconductor device according to the present invention.

Figure 5A:
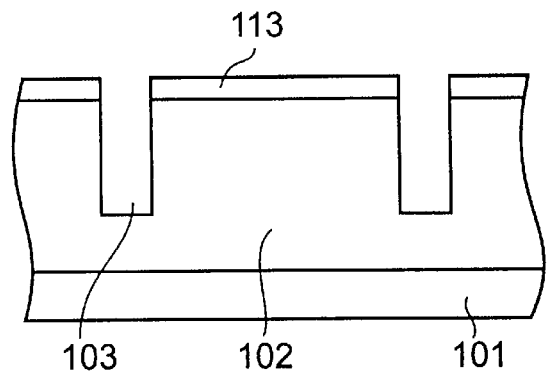
FIGS. 5A to 5E are sectional views in order of steps, showing the first manufacture method of the second embodiment of the semiconductor device of the present invention.

FIG. 5A shows a method comprising the steps of forming the N-type low impurity concentration drift layer 102 on the N-type high impurity concentration semiconductor substrate 101 by an epitaxial growth process, depositing the mask oxide film 113 by about 2000 angstroms to 1 μm by a CVD process, patterning the mask oxide film 113 by a photolithography process and etchinq process, and subsequently stripping a resist and using the patterned mask oxide film 113 as the mask to form the trench 103 in the low impurity concentration drift layer 102 by a dry etching process.

The density of the high impurity concentration semiconductor substrate and the density and thickness of the low impurity concentration drift layer, and further the width and depth of the trench are similar to those in the embodiment shown in FIG. 3.

Moreover, similarly as FIG. 3, the mask oxide film 113 may be an oxide film of NSG, PSG or TEOS.

Figure 5B:
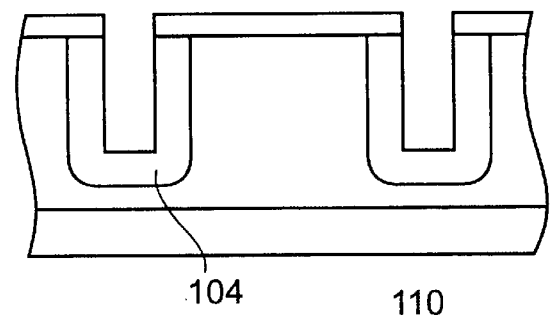

Subsequently, as shown in FIG. 5B, by introducing the impurity by the ion injection (or implantation) process or the molecular layer doping process and subsequently performing the heat treatment, the P-type diffusion layer 104 is formed on the side wall and bottom wall of the trench. For the density and diffusion amount of the diffusion layer 104, similarly as the embodiment of FIG. 3, the density is of the order of $1\times10^{16}/cm^3$ to $1\times10^{16}/cm^3$ and the diffusion amount is of the order of 0.5 to 2 μm.

Figure 5C:
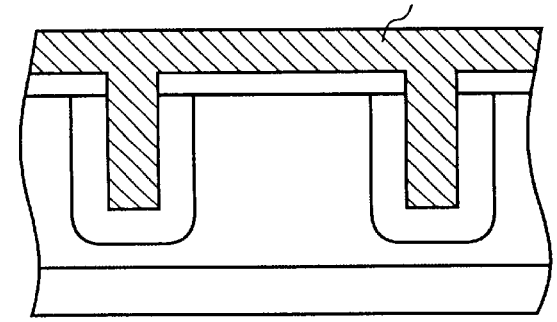

Subsequently, as shown in FIG. 5C, the polycrystalline silicon 110 is deposited inside the trench 103 and on the mask oxide film 113 by a CVD process. In this case, since the thickness of polycrystalline silicon needs to be equal to or more than the trench width, the deposition of the order of 0.5 μm to 2 μm is performed. For polycrystalline silicon, film stress is large, warpage of the semiconductor substrate sometimes becomes large with one deposition, and to avoid this the deposition may be performed a plurality of times in a divided manner.

Figure 5D:
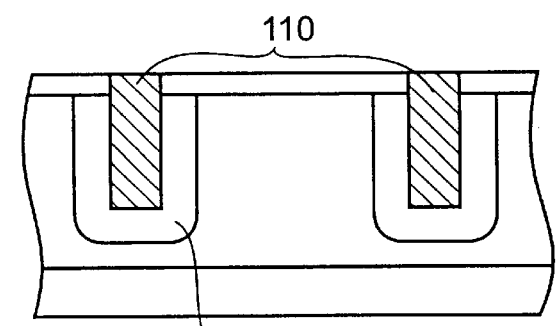

Subsequently, as shown in FIG. 5D, the polycrystalline silicon 110 is etched back by the dry etching process. The etching is ended by end point detection upon exposing of the mask oxide film 113. Moreover, this step may be performed by a chemical mechanical polishing (CMP) process.

Figure 5E:
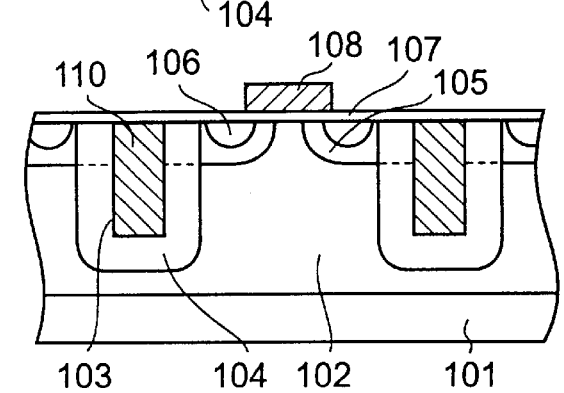
Figure 6:
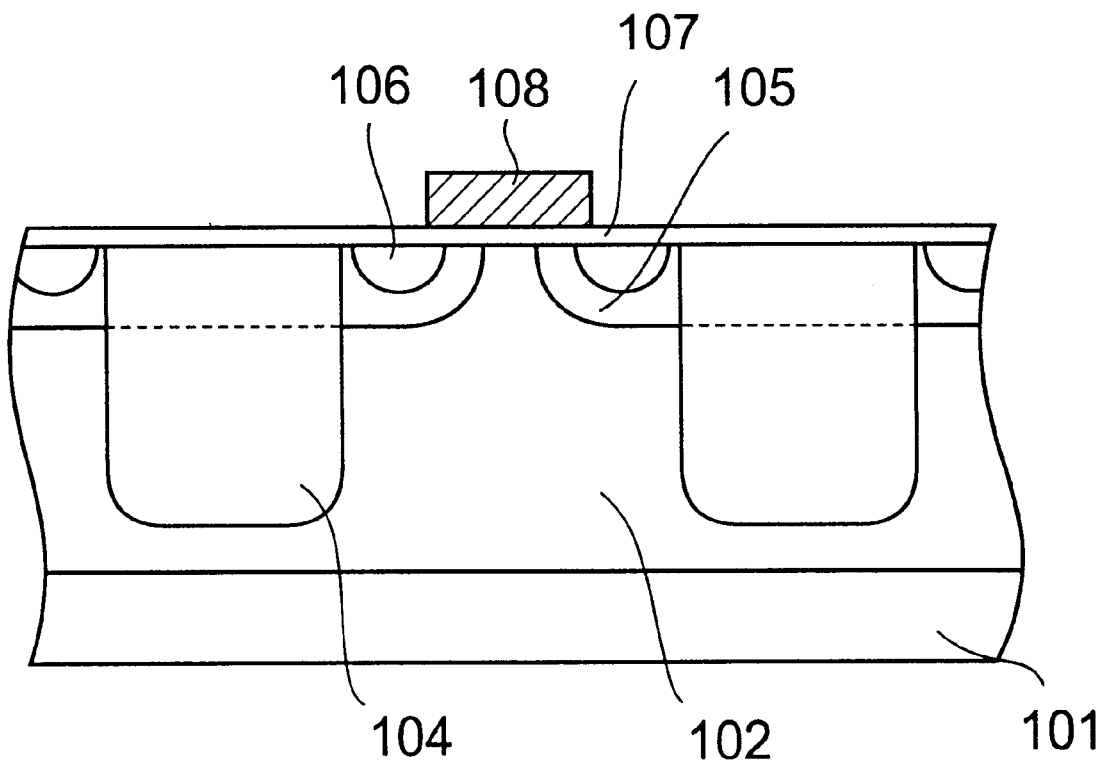
FIG. 6 is a schematic sectional view showing one example of a conventional semiconductor device.

Subsequently, by removing the mask oxide film 113 and successively forming the gate oxide film, gate electrode body diffusion layer, and source similarly as in the embodiment of FIG. 3, the structure of the second embodiment of the semiconductor device of the present invention shown in FIG. 5E can be formed.

In the manufacture method shown in FIG. 5, the mask step relating to the trench formation and filling may be performed only once, and as compared with the embodiment of FIG. 3 so that there is an advantage in that the number of steps is reduced.

Moreover, in the embodiment shown in FIG. 5, while the diffusion layer 104 is formed after the trench formation, but similarly to the embodiment of FIG. 4, may be formed by using polycrystalline silicon doped with an impurity, that is, by using a doped poly-process to embed polycrystalline silicon into the trench and subsequently performing heat treatment to diffuse the impurity from polycrystalline silicon, forming the diffusion layer on the trench side wall and bottom wall, and performing the subsequent steps while embedded polycrystalline silicon is left as it is, so that it is possible to obtain the structure shown in the second embodiment of the semiconductor device of the present invention shown in FIG. 2.

While the aforementioned embodiments have been described with reference to an N-type power MOSFET, manufacture of a P-type power MOSFET can be achieved by reversing the conductivity types.

As described above, according to the structure and manufacture method of the power MOSFET of the present invention, it is possible to supply the power MOSFET semiconductor device high in breakdown voltage and low in resistance at a low cost and in a short manufacture turn-around time.

What is claimed is:

1. A semiconductor device comprising: a high impurity concentration first conductivity type semiconductor substrate; a low impurity concentration first conductivity type semiconductor layer formed on a surface of the semiconductor substrate; a trench selectively formed in a surface of the low impurity concentration first conductivity type semiconductor layer; first conductivity type polycrystalline silicon filled inside the trench; a low impurity concentration second conductivity type semiconductor diffusion layer formed on a side wall and a bottom wall of the trench; a relatively shallow low impurity concentration second conductivity type semiconductor diffusion layer partially overlapped with the low impurity concentration second conductivity type semiconductor diffusion layer and selectively formed on the surface of the low impurity concentration first conductivity type semiconductor layer; a high impurity concentration first conductivity type semiconductor diffusion layer selectively formed on the relatively shallow low impurity concentration second conductivity type semiconductor diffusion layer; a gate insulation film formed on the low impurity concentration first conductivity type semiconductor layer and the relatively shallow low impurity concentration second conductivity type semiconductor diffusion layer; and a gate electrode selectively formed on the gate insulation film.

2. A semiconductor device according to claim 1; further comprising an insulation film filled inside the trench formed in the low impurity concentration first conductivity type semiconductor layer.

3. A semiconductor device according to claim 1; wherein the low impurity concentration first conductivity type semiconductor layer comprises an epitaxially grown layer.

4. A semiconductor device according to claim 1; wherein a depth of the trench is in the range of about 3 to 10 $\mu$m.

5. A semiconductor device according to claim 1; wherein the low impurity concentration second conductivity type semiconductor diffusion layer has an impurity density in the range of about $1 \times 10^{16}/cm^3$ to $1 \times 10^{18}/cm^3$, and a diffusion depth thereof is in the range of about 0.5 to 2 $\mu$m.

6. A semiconductor device comprising: a high impurity concentration first conductivity type semiconductor substrate comprised of single crystal silicon including antimony or arsenic with a density of $1 \times 10^{19}/cm^3$ to $1 \times 10^{20}/cm^3$; a low impurity concentration first conductivity type semiconductor layer formed on a surface of the semiconductor substrate; a trench selectively formed in a surface of the low impurity concentration first conductivity type semiconductor layer; a low impurity concentration second conductivity type semiconductor diffusion layer formed on a side wall and a bottom wall of the trench; a relatively shallow low impurity concentration second conductivity type semiconductor diffusion layer partially overlapped with the low impurity concentration second conductivity type semiconductor diffusion layer and selectively formed on the surface of the low impurity concentration first conductivity type semiconductor layer; a high impurity concentration first conductivity type semiconductor diffusion layer selectively formed on the relatively shallow low impurity concentration second conductivity type semiconductor diffusion layer; a gate insulation film formed on the low impurity concentration first conductivity type semiconductor layer and the relatively shallow low impurity concentration second conductivity type semiconductor diffusion layer; and a gate electrode selectively formed on the gate insulation film.

7. A semiconductor device comprising: a high impurity concentration first conductivity type semiconductor substrate; a low impurity concentration first conductivity type semiconductor layer formed on a surface of the semiconductor substrate, the low impurity concentration first conductivity type semiconductor layer comprising an epitaxially grown layer having a phosphorous density of $1 \times 10^{14}/cm^3$ to $1 \times 10^{16}/cm^3$; a trench selectively formed in a surface of the low impurity concentration first conductivity type semiconductor layer; a low impurity concentration second conductivity type semiconductor diffusion layer formed on a side wall and a bottom wall of the trench; a relatively shallow low impurity concentration second conductivity type semiconductor diffusion layer partially overlapped with the low impurity concentration second conductivity type semiconductor diffusion layer and selectively formed on the surface of the low impurity concentration first conductivity type semiconductor layer; a high impurity concentration first conductivity type semiconductor diffusion layer selectively formed on the relatively shallow low impurity concentration second conductivity type semiconductor diffusion layer; a gate insulation film formed on the low impurity concentration first conductivity type semiconductor layer and the relatively shallow low impurity concentration second conductivity type semiconductor diffusion layer; and a gate electrode selectively formed on the gate insulation film.

8. A semiconductor device comprising: a high impurity concentration first conductivity type semiconductor substrate; a low impurity concentration first conductivity type semiconductor layer formed on a surface of the semiconductor substrate, the low impurity concentration first conductivity type semiconductor layer comprising an epitaxially grown layer having a thickness in the range of about five to a dozen $\mu$m; a trench selectively formed in a surface of the low impurity concentration first conductivity type semiconductor layer; a low impurity concentration second conductivity type semiconductor diffusion layer formed on a side wall and a bottom wall of the trench; a relatively shallow low impurity concentration second conductivity type semiconductor diffusion layer partially overlapped with the low impurity concentration second conductivity type semiconductor diffusion layer and selectively formed on the surface of the low impurity concentration first conductivity type semiconductor layer; a high impurity concentration first conductivity type semiconductor diffusion layer selectively formed on the relatively shallow low impurity concentration second conductivity type semiconductor diffusion layer; a gate insulation film formed on the low impurity concentration first conductivity type semiconductor layer and the relatively shallow low impurity concentration second conductivity type semiconductor diffusion layer; and a gate electrode selectively formed on the gate insulation film.

9. A semiconductor device comprising: a high impurity concentration first conductivity type semiconductor substrate; a low impurity concentration first conductivity type semiconductor layer epitaxially grown on a surface of the semiconductor substrate; a trench selectively formed in a surface of the low impurity concentration first conductivity type semiconductor layer, the trench being slightly shallower than the epitaxially grown layer a low impurity concentration second conductivity type semiconductor diffusion layer formed on a side wall and a bottom wall of the trench; a relatively shallow low impurity concentration second conductivity type semiconductor diffusion layer partially overlapped with the low impurity concentration second conductivity type semiconductor diffusion layer and selectively formed on the surface of the low impurity concentration first conductivity type semiconductor layer; a high impurity concentration first conductivity type semiconductor diffusion layer selectively formed on the relatively shallow low impurity concentration second conductivity type semiconductor diffusion layer; a gate insulation film formed on the low impurity concentration first conductivity type semiconductor layer and the relatively shallow low impurity concentration second conductivity type semiconductor diffusion layer; and a gate electrode selectively formed on the gate insulation film.

10. A semiconductor device comprising: a semiconductor substrate; a semiconductor layer having a first conductivity type formed on the semiconductor substrate; a trench formed in the semiconductor layer, the inside of the trench being filled with polycrystalline silicon; a first semiconductor diffusion layer having a second conductivity type formed on a side wall and a bottom wall of the trench; a second semiconductor diffusion layer having the second conductivity type formed on the surface of the first conductivity type semiconductor layer partially overlapping the first semiconductor diffusion layer; a third semiconductor diffusion layer having the first conductivity type formed on the second semiconductor diffusion layer; a gate insulation film formed on the first conductivity type semiconductor layer and the second conductivity type semiconductor diffusion layer; and a gate electrode formed on the gate insulation film.

11. A semiconductor device according to claim 10; wherein the semiconductor layer formed on the semiconductor substrate is an epitaxially grown film.

12. A semiconductor device comprising: a semiconductor substrate comprised of single crystal silicon including antimony or arsenic with a density of $1\times10^{19}/cm^3$ to $1\times10^{20}/cm^3$; a semiconductor layer having a first conductivity type formed on the semiconductor substrate; a trench formed in the semiconductor layer; a first semiconductor diffusion layer having a second conductivity type formed on a side wall and a bottom wall of the trench; a second semiconductor diffusion layer having the second conductivity type formed on the surface of the first conductivity type semiconductor layer partially overlapping the first semiconductor diffusion layer; a third semiconductor diffusion layer having the first conductivity type formed on the second semiconductor diffusion layer; a gate insulation film formed on the first conductivity type semiconductor layer and the second conductivity type semiconductor diffusion layer; and a gate electrode formed on the gate insulation film.

13. A semiconductor device comprising: a high impurity concentration first conductivity type semiconductor substrate, the first conductivity type semiconductor layer comprising an epitaxially grown layer having a phosphorous density of $1\times10^{14}/cm^3$ to $1\times10^{16}/cm^3$; a low impurity concentration first conductivity type semiconductor layer formed on a surface of the semiconductor substrate; a trench selectively formed in a surface of the low impurity concentration first conductivity type semiconductor layer; a low impurity concentration second conductivity type semiconductor diffusion layer formed on a side wall and a bottom wall of the trench; a relatively shallow low impurity concentration second conductivity type semiconductor diffusion layer partially overlapped with the low impurity concentration second conductivity type semiconductor diffusion layer and selectively formed on the surface of the low impurity concentration first conductivity type semiconductor layer; a high impurity concentration first conductivity type semiconductor diffusion layer selectively formed on the relatively shallow low impurity concentration second conductivity type semiconductor diffusion layer; a gate insulation film formed on the low impurity concentration first conductivity type semiconductor layer and the relatively shallow low impurity concentration second conductivity type semiconductor diffusion layer; and a gate electrode selectively formed on the gate insulation film.

14. A semiconductor device according to claim 13; wherein a thickness of the epitaxially grown layer is in the range of about five to a dozen $\mu$m.

15. A semiconductor device according to claim 13; wherein the trench is slightly shallower than the epitaxially grown layer.

16. A semiconductor device according to claim 15; wherein a depth of the trench is in the range of about 3 to 10 $\mu$m.

17. A semiconductor device according to claim 15; wherein the first semiconductor diffusion layer has an impurity density in the range of about $1\times10^{16}/cm^3$ to $1\times10^{18}/cm^3$, and a diffusion depth thereof is in the range of about 0.5 to 2 $\mu$m.

* * * * *